United States Patent [19]

von Gentzkow et al.

[11] Patent Number: 5,364,893
[45] Date of Patent: Nov. 15, 1994

[54] COMPOSITION OF POLYEPOXIDE AND PHOSPHOROUS-CONTAINING POLYEPOXIDE

[75] Inventors: Wolfgang von Gentzkow, Kleinsendelbach; Juergen Huber, Erlangen; Wolfgang Rogler, Moehrendorf; Dieter Wilhelm, Forchheim, all of Germany

[73] Assignee: Siemens Aktiengesellschaft, Munich, Germany

[21] Appl. No.: 487,627

[22] Filed: Mar. 2, 1990

[30] Foreign Application Priority Data

Mar. 3, 1989 [EP] European Pat. Off. ......... 89103801.0

[51] Int. Cl.$^5$ .................. C08K 5/54; C08L 63/02; C08L 63/04
[52] U.S. Cl. ..................... 523/429; 525/486; 525/525; 525/526
[58] Field of Search ............... 525/484, 525, 486, 526; 523/429

[56] References Cited

U.S. PATENT DOCUMENTS

| | | | |
|---|---|---|---|
| 3,856,757 | 12/1974 | Satomura | 528/73 |
| 4,347,343 | 8/1982 | Brewbaker | 525/530 |
| 4,713,137 | 12/1987 | Sexton | 525/511 |
| 4,812,490 | 3/1989 | Kleeberg et al. | 523/443 |

FOREIGN PATENT DOCUMENTS 51-143620 12/1976 Japan.

OTHER PUBLICATIONS

Hoeschst AG, "Phosphorus-containing epoxide resins", *Chemical abstracts*, abstract No. 77:16697y, 1977.
Abstract of Japanese Patent No. 51-143620 published Dec. 10, 1976.
The Condensed Chemical Dictionary, Eighth Edition, Van Nostrand Reinhold Co., New York, N.Y., 1971, p. 230.
"Chemical Abstracts", vol. 94, No., abstract No. 193199u, (Jun. 15, 1981) p. 37.
"Chemical Abstracts", vol. 91, No. 6, abstract No. 40180u, (Aug. 6, 1979), p. 22.
"Chemical Abstracts", vol. 99, No. 26, abstract No. 213394n, (Dec. 26, 1983), p. 34.
"Chemical Abstracts", vol. 106, No. 18, abstract No. 139155e, (May 4, 1987), p. 29.

*Primary Examiner*—Robert E. Sellers
*Attorney, Agent, or Firm*—Kenyon & Kenyon

[57] ABSTRACT

The invention provides epoxide resin molding compositions for protectively covering semiconductor components, which are accessible in a cost-effective manner and have good processability. The epoxide resin molding compositions provide virtually inflammable molded materials with a high glass transition temperature and a low thermal expansion coefficient without the addition of flameproofing agents, when they contain the following constituents:

(A) an aromatic and/or heterocyclic polyepoxide resin which is free of phosphorous, optionally in combination with an aliphatic epoxide resin;
(B) an epoxide-group-containing phosphorous compound;
(c) an aromatic polyamine as a curing agent; and
(D) filler material.

17 Claims, No Drawings

COMPOSITION OF POLYEPOXIDE AND PHOSPHOROUS-CONTAINING POLYEPOXIDE

FIELD OF THE INVENTION

The invention relates to epoxide resin molding compositions for protectively covering semiconductor components as well as epoxide resin molded materials prepared from these molding compounds.

BACKGROUND OF THE INVENTION

Components for electronics and for low-voltage technology are sensitive to external influences and are corrodible. To guarantee their operation, these components must be protected from unfavorable environmental influences such as moisture, aggressive chemicals and dust as well as from mechanical damage. Nowadays this takes place in technology primarily by protectively covering or embedding the components with curable, i.e. thermoplastic molding compounds, also called molding materials. By far, epoxide resin molding compounds have become the leading family of this application field due to their good processing behavior and the good properties of the molded materials and a favorable price/efficiency ratio. An overview of the composition, processing and material properties and use of epoxide resin molding compounds is found e.g. in G. W. Becker and D. Braun, "Kunststoffhandbuch" (Plastics Handbook), Carl Hasset Verlag Munich, Vienna 1988, Vol. 10 "Duroplaste" (Thermoserring Plastics), pp. 338 to 367.

Epoxide resin molding compositions are with inorganic filler materials highly-filled mixtures of epoxide resins with curing agents, accelerators, flameproofing agents, lubricating and release agents, pigments and other additives such as flexibilizers and coupling reagents. They are produced either in the dry mixing process, melting process, or impregnation process and are distributed commercially as virtually dust-free, granular material or in the form of pellets. A prereaction of the resinous mixture takes place during production and dressing preparation. For the handling and further processing of the molding compositions, it is important that, on the one hand, the pre-reacted mixture be very stable at low temperatures, that is, e.g., be storable below 5° C. for 6 months, and, on the other hand, melt quickly at the processing temperature (approx. 150° to 180° C.), become well able to flow and cure quickly with the least possible reactive shrinkage. Cycle times of a few minutes are being currently realized during the encasement of electronic components right up to their being released from the mold. However, one is still striving to reduce this time further.

The requirement for a highest possible glass transition temperature $T_G$ is acknowledged for both the processing as well as for the protective function of the cured molding compositions. This temperature $T_G$ should lie at least above the mold temperature of 150° to 180° C. in order to guarantee a sufficient mold-release rigidity during the molding process. The glass transition temperature should be higher than the highest locally-appearing operating and processing temperatures for the optimum protection of the components because otherwise important properties of the molded material will deteriorate rapidly when the glass transition temperature is exceeded. Thus, for instance, the diffusion rate of moisture and other materials sharply increases; the dielectric constant and the dissipation factor increase and, due to the elevation of the thermal expansion coefficient the transverse strain between the molding compositions and the component increases and can possibly cause damage to the component. Since a high temperature strain arises during the soldering process (soldering bath temperature: 270° to 290° C., the $T_G$ should be >200° C.

The sensitivity of microelectronic components to mechanical wear and tear increases with their increasing miniaturization so that the stresses exerted on the components during temperature changes are no longer tolerable in conventional protective covering compositions. Recently, therefore, so-called "low-stress" molding compounds have been developed which only exert slight force on the components when the temperature changes. This "low stress" behavior property is obtained through molding compound additives such as organopolysiloxanes or functional butadiene/acrylnitrile polymers, which retain their flexibilizing effect at lower temperatures (c.f.: US Pat. No. 4,701,482, JP-OS 62-214650, JP-OS 62-128162).

To maintain the protective function of the molding compositions, it is important that the molding compositions: be as free as possible from corrosive constituents such as $Cl^-$, $Br^-$, and $Na^+$, hydrolyzable chlorine and alpha-radiating impurities; have a good substrate adhesion after curing; be resistant to moisture and organic solvents; and be impermeable and satisfy the mechanical and thermal property requirements (bending strength $\geq 100$ N/mm², impact resistance $\geq 5$ Nmm/mm², linear expansion coefficient $\alpha \sim 15$ to $25 \times 10^6$ K$^{-1}$).

Furthermore, the cured molding compositions must be inflammable or self-extinguishing and withstand one of the most demanding standard material tests, namely the flammability test according to UL 94V, with a V-O rating. During this test, five vertically-clamped standard test pieces, respectively, are twice held in flames on the lower end for 10 seconds each. The sum of the ten postburning times, which cease at extinguishment, must be <50 seconds and no single value may exceed 10 seconds. This requirement is difficult to fulfill, above all at thin wall thicknesses of 1.6 nun and under, as is typical in the electronics industry.

Epoxide resin molding compositions found in technical application fulfill these requirements only because they contain up to 80% inflammable inorganic filler materials and the remaining portion of reactive resin is fortified to be virtually inflammable by considerable portions of core-brominated aromatic constituents or additives and high concentrations of antimony trioxide. The problems with these compositions consist in that they are, on the one hand, indeed excellent, effective flameproofing agents; on the other hand, however, they also have some very dangerous properties. Antimony trioxide is on the list of carcinogenic chemicals. Aromatic bromine compounds not only split off bromine radicals and hydrobromic acid during thermal decomposition which cause pronounced corrosion. In addition, during decomposition in the presence of oxygen, the highly brominated aromatics in particular can form highly toxic polybromodibenzofurans and Polybromodibenzodioxins. Moreover, the disposal of bromine-containing waste materials and toxic waste presents considerable difficulties.

The epoxide resin molding compositions found in technical application do indeed have a very favorable processing behavior property, but after curing they only reach a glass transition temperature in the range of 150° to 180° C. Materials which fulfill the requirement for elevated heat resistance are molding compositions on a polyimide base. However, due to the considerably higher material costs and their poor processing behavior property, which requires higher curing temperatures and longer curing times, the technical application of such molding compositions remains limited to special applications. As a possible alternative to the epoxide resins found in technical application, combinations of maleinimides with alkenylphenols and/or alkenylphenol ethers (DE-OS 26 27 045), of maleinimides, polyallylphenols and epoxide resins (JP-OS 53-134099) or combinations of alkenylaryloxy-group-containing s-triazine compositions and polymaleinimides (EP-OS 0 263 915) are discussed.

A comparatively cost-effective resin system is obtained when aromatic and/or heterocyclic polyepoxide resins, i.e. polyglycidyl compounds, are combined with aromatic polyamines as a curing agent. These kinds of polyamines, which e.g. are known from DE-PS 27 43 680, produce particularly age-stable, heat-deformation resistant lattice network polymers. It can be seen from EP-OS 0 271 772 that while using 1.3.5-tris(3-amino-4-alkylphenyl)-2.4-6-trioxo-hexahydrotriazines as a curing agent, molded compositions are obtained which have glass transition temperatures to 245° C. and are distinguished by favorable processing and working properties.

The disadvantage of not being sufficiently inflammable is acknowledged for all of the resin systems mentioned. Therefore, to fulfill the requirement—which is indispensable for electronics—of withstanding the flammability test according to UL 94V with a rating V-O, the use of highly effective bromine-containing flameproofing agents and antimony trioxide cannot be dispensed with (c.f. DE-OS 27 00 363). This has the consequence that one must allow for, on the one hand, the potential for danger connected with bromine compounds and antimony trioxide and, on the other hand, a deterioration of the quality of the thermo-mechanical properties effected by the bromine compounds. Namely, it is known that the addition of core-brominated aromatics causes a reduction of the glass transition temperature. Thus, it was found, e.g., that the glass transition temperature of polyimides is reduced by the addition of bromine compounds by 40° to 70° C. (c.f. "Polymer Journal", Vol. 20 (1988), pp. 125 fol.). In the systems of epoxides and polyamines described in EP-OS 0 271 772, a reduction of the $T_G$ by approximately 50° C. to values below 200° C. is found during a partial substitution of the epoxide constituents by the corresponding brominated compound according to a total bromine concentration of 4%.

For these reasons there has not been a lack of attempts to replace the bromine-containing flameproofing agent in reaction resin systems with less problematical substances. Thus, for example, filler materials were suggested which have a quenching gas effect such as hydrated aluminum oxides (c.f. "J. Fire and Flammability", Vol.3 (1972), pp. 51 fol.), alkaline aluminum carbonates (c f "Plast Engng" Vol 32 (1976), pp 41 fol.) and magnesium hydroxides (EP-OS 0 243 201) as well as vitrifying filler materials such as borates (c.f. "Modern Plastics" Vol 47 (1970), pp. 140 fol.) and phosphates (U.S. Pat. Nos. 2,766,139 and 3,398,019). However, associated with all of these filler materials is the disadvantage that, in part, they considerably deteriorate the mechanical, chemical and electrical properties of the molded materials.

The flame-retarding effectiveness of red phosphorous has also already been described (GB-patent 1 112 139), optionally in combination with finely dispersed silicon dioxide or hydrated aluminumoxide (U.S. Pat. No. 3,373,135). In this manner, molded materials are obtained which limit the application for electrotechnical and electronic purposes due to phosphoric acid which may possibly result under unfavorable conditions and the corrosion which is connected with the phosphoric acid. Furthermore, organic phosphorous compounds such as phosphoric acid esters, phosphonic acid esters and phosphines have already been suggested as flame-retarding additives (c.f. W. C. Kuryla and A. J. Papa "Flame Retardancy of Polymeric Materials", Vol. 1, pp. 24–38 and 52–61, Marcel Dekker Inc., New York, 1973). Since these compounds are known for their "plasticizing" properties and are used globally to a large extent as plasticizers for polymers (GB-patent 10 794), this alternative, too, is not very promising with regard to the required thermal resistance of molded materials.

A more effective possibility for regulating the inflammability of epoxide resins consists in using phosphorous compounds which can be anchored in the polymer network such as epoxide-group-containing phosphorous compounds. The thermo-mechanical properties of the molded materials obtained in this case during curing, however, are not sufficient. Thus, for example, molded materials with a $T_G$ of 45° to 80° C. are obtained during the aminic curing of epoxide resins resulting from methyl diglycidyl phosphonate and dicarboxylic acids (c.f. "Vysokomol. Soedin.", Ser. B. 29 (1), pp. 45 to 47 (1987)). This agrees with the experience that phosphoric acid ester groupings, both in the main polymer chain as well as in the side chain, basically cause a plasticization and thus a lowering of the glass transition temperature (c.f. "Journal of Macromolecular Science", Vol. Cl, No. 1 (1967), pp. 3 fol.). Moreover, to a large extent these compounds are liquid or crystalline and therefore do not come into question for regulating the inflammability of epoxide resins since they either greatly lower the softening point of the solid resins, produce stickiness or—in the case of crystalline compounds recrystallize (c.f. DE-OS 25 38 675). In all known publications, epoxide-group-containing phosphorous compounds are therefore converted first in a prereaction with bisphenols or phenolic resins (DE-OS 25 38 675 and JP-OS 58-185631), with dicarboxylic acids (c.f. Vysokomol. Sosdin."Ser. B. 29 (1), pp. 45–47 (1987)) or with polyester resins from dihydroxy compounds and dicarboxylic acids (JP-OS 50-043221) and only then are the converted compounds cured —primarily ionically— in a mixture with the epoxide resins. However, the inflammability achieved in this manner is modest. Thus, limiting oxygen index values ("LOI values") of 23.5 to 24, i.e. values like those one finds in flammable materials such as wool (LOI =25), are achieved in resins which are obtained by means of a prereaction with bisphenols (c.f. DE-OS 25 38 675), whereas the LOI values for known inflammable materials such as polysulphone (LOI =30), polyvinyl chloride (LOI =42), polyvinylidene chloride (LOI =60) and polytetrafluoroethylene (LOI =95) lie considerably higher (c.f. D. W. v. Krevelen "Properties of Polymers", Elsevier Scientific Publishing Comp., Pasterdam, Oxford, N.Y., 1976, pp. 526 fol.). In the case of the conversion products of polyester resins with triglycidyl phosphates (c.f. JP-OS 50-043221), even halogen compounds and antimony trioxide must be added to regulate the inflammability of polyester fibers.

It is therefore an object of the invention to specify epoxide resin molding compositions which are accessible in a cost-effective manner and are comparable in processibility to epoxide resin molding compounds found in technical application, and which yield inflammable molded materials which can be rated as V-O according to UL 94 V with a highest possible glass transition temperature ($T_G > 200°$ C.) and a lowest possible thermal expansion coefficient ($\sim 15$ to $25 \times 10^6$ $K^{-1}$) without the addition of halogen compounds or antimony trioxide.

SUMMARY OF THE INVENTION

The invention provides epoxide resin molding composites which include the following constituents:
(A) an aromatic and/or heterocyclic polyepoxide resin which is free of phosphorous, optionally in combination with an aliphatic epoxide resin;
(B) an epoxide-group-containing phosphorous compound of the following structure:

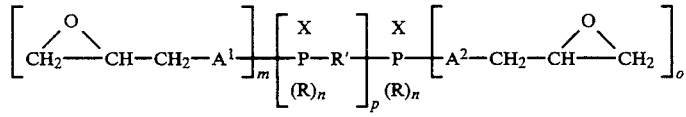

with $m=0$ or 1, $n=0$, 1 or 2 and $o=1$, 2 or 3, and wherein the following holds: $m+n+o=3$, and with $p=0$, 1 or 2;

X signifies a free electron pair or an O— or S—atom bonded by way of a double bond;

R signifies an alkyl residue having 1 to 4 C-atoms; alkenyl residue having 2 to 3 C-atoms; aryl residue such as phenyl, alkoxyphenyl, nitrophenyl, naphthyl and biphenyl; arylalkyl residue such as benzyl; dialkyl-amino residue or alkyl-aryl-amino residue or 3-trialkylsilyl-propyl residue; R being bonded directly or by way of O or S;

R' denotes a bridge of O, S, phenylene, dioxyphenylene, dioxynaphthylene, $(CH_2)_r$, $O-(CH_2)_r$, $O-(CH_2)_r-O$ or $O-(CH_2)_r-(Si(CH_3)_2-O)_s-Si(CH_3)_2-(CH_2)_r-O$ with $r=1$ to 3 and $s=1$ to 8, or $(O-CH_2-CH_2)_r-O$, $(O-CH(CH_3)-CH_2)_r-O$ or $(O-(CH_2)_4)_r-O$ with $t=2$ to 100; and $A^1$ and $A^2$, which can be equal or different, denote a single bond or a bridge according to the grouping R';

(C) an aromatic polyamine as a curing agent of the following structure:

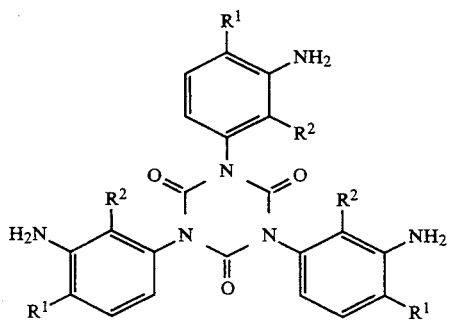

wherein on each of the three aromatic partial structures, one of the residues $R^1$ and $R^2$ respectively denotes H and the other alkyl; and (D) filler material.

It was discovered as a complete surprise that both the inflammability as well as the mechanical stability of the resultant reaction resin molded materials is distinctly increased with the use of a combination of constituents of the aforesaid type; i.e., of aromatic and/or heterocyclic polyepoxide resins which are free of phosphorous, epoxide-group-containing phosphorous compounds, polyamines (as curing agents) and filler materials. Moreover, it was surprisingly discovered that the combination of the constituents (A), (B), (C) and (D) according to the invention is able to be processed in a manner which is cost-effective and comparable or even better than the epoxide resins found in technical application. The prereaction of liquid or crystalline epoxide-group-containing phosphorous compounds with bisphenols or dicarboxylic acids, described as necessary in the prior art, is therefore not required.

DETAILED DESCRIPTION OF THE INVENTION

The following compounds are suitable as a polyepoxide resin, i.e., a polyglycidyl compound: aromatic polyglycidyl ethers such as bisphenol-A-diglycidyl ether, bisphenol-F-diglycidyl ether and bisphenol-S-diglycidyl ether; polyglycidyl ethers of phenol/formaldehyde resins and cresol/formaldehyde resins, resorcinol diglycidyl ether and tetrakis (p-glycidylphenyl) ethane; di- or polyglycidyl esters of phthalic, isophthalic and terephthalic acid as well as of trimellitic acid; N-glycidyl compounds of aromatic amines and heterocyclic nitrogen bases such as N-N-diglycidyl-aniline, N.N.O-triglycidyl-p-aminophenol, triglycidyl isocyanurate and $N.N.N^1.N^1$-tetraglycidyl-bis (p-aminophenyl)-methane, hydantoin epoxide resins and uracil epoxide resins; as well as di- and polyglycidyl compounds of polyvalent aliphatic alcohols, such as 1.4 butanediol, trimethylol propane and polyalkylene glycols. Furthermore, modified epoxide resins are also suitable as constituent (A), e.g. oxazolidinone-modified epoxide resins. These types of compounds are already known (c.f. "Angew. Makromol. Chem.", Vol. 44 (1975), pp. 151 to 163, as well as U.S. Pat. No. 3,334,110); mentioned for this purpose as an example is the conversion product of bisphenol-A-diglycidyl ether with diphenylmethane diisocyanate (in the presence of a suitable accelerator). The conversion products of epoxide resins with amine-modified bismaleinimides are mentioned as further examples of modified epoxide resins. The polyepoxide resins can be present in the epoxide resin molding compounds according to the invention singly or in a mixture. An epoxidized novolak resin is preferably used as a polyepoxide resin.

The constituent (B) can also be used both in the form of single compounds as well as in the form of a mixture of several compounds. For example, the following epoxide-group-containing phosphorous compounds, all of which are already known, are suitable as constituent (B): methyl diglycidyl phosphonate, ethyl diglycidyl phosphonate, propyl diglycidyl phosphonate, butyl diglycidyl phosphonate, vinyl diglycidyl phosphonate, phenyl diglycidyl phosphonate and biphenyl diglycidyl phosphonate; methyl diglycidyl phosphate, ethyl diglycidyl phosphate, n-propyl diglycidyl phosphate, n-butyl diglycidyl phosphate, isobutyl diglycidyl phosphate, allyl diglycidyl phosphate, phenyl diglycidyl phosphate, p-methoxyphenyl diglycidyl phosphate, p-ethoxyphenyl diglycidyl phosphate, P-propyloxyphenyl diglycidyl phosphate, p-isopropyloxyphenyl diglycidyl phosphate, phenylthiodiglycidyl phosphate, triglycidyl phosphate, tris(glycidylethyl) phosphate, P-glycidylphenyl ethyl glycidyl phosphate and benzyl diglycidyl thiophosphate.

The synthesis of these compounds is accomplished, for example, by reacting phosphonic-acid chlorides or phosphoric-acid chlorides with glycidol (c.f.: "Zh. Obshch. Khim.", Vol. 54, Issue 10 (1984), pp 2404 fol), by reacting phosphoric acid or phosphonic acids with epichlorohydrin (Japanese Published Patent Application 51-143620) or by epoxidizing phosphorous compounds, which contain residues with olefinic double bonds (U.S. Pat. No. 2,856,369).

The mixture ratio of the constituents (A) and (B) is able to be varied—in accordance with the desired property spectrum—within a broad range. For certain applications, it is even possible to do completely without the constituent (A). The mixture ratio of (A) to (B) in the case of the epoxy resin molding compositions advantageously amounts to 10:1 to 1:10 and preferably 4:1 to 1:4, particularly 2:1 to 1:2.

The aromatic polyamines used as curing agents in the epoxy resin molding compositions according to the invention are already known to some degree. Polyamines of the indictaed structure with $R^1$=alkyl and $R^2$=H are described in the European Published Patent Application 0 271 772. They are prepared through the trimerization of 2.4-diisocyanato-alkylbenzenes and the subsequent hydrolysis of the remaining isocyanate groups. Compositions with $R^1$=H and $R^2$=alkyl are obtained analogously through the trimerization of 2.6-diisocyanato-alkylbenzenes and subsequent hydrolysis. In the epoxide resin molding compositions according to the invention polyamines of both of the aforesaid types as well as mixtures of these compounds can be used as constituent (C). Moreover, polyamines can also be used which are obtained through the trimerization of mixtures of 2.4- and 2.6 diisocyanato alkylbenzene and the subsequent hydrolysis of the trimerization products. These kinds of mixtures are available on a large technical scale and allow a cost-effective production of the curing agent component.

A reaction between the isocyanate groups and amino groups can also take place during hydrolysis of the isocyanate-group-containing trimerization products. In this manner, heterocyclic polyamines with urea groupings are obtained as a by-product of the hydrolysis reaction. These types of polyamines can be used as additive curing agent component in the epoxide resin molding compositions according to the invention, i.e. find application in the mixture with the actual curing agent. Besides the actual curing agent or in addition to curing agent mixtures of the aforesaid type, aromatic polyamines of other types such as 4.4'diaminodiphenyl methane and 4.4' diaminodiphenyl sulfone, and/or other heterocyclic polyamines can also be used in the epoxide resin molding compositions. The concentration of these types of polyamines in the curing mixture generally amounts to a maximum of 30 mass-%.

The ratio between the applied epoxide function (constituents A and B) and the applied amine-hydrogen function NH (constituent C) can amount to 0.9:1 to 1.5:1 in the epoxide resin molding compositions according to the invention; advantageously, it amounts to 0.9:1 to 1.1:1, and preferably approximately 1:1.

Powdery inorganic and/or organic materials serve as filler materials in the epoxide resin molding compositions according to the invention. These filler materials can also find application in a mixture with inorganic and/or organic short fibers, e.g. in the form of textile glass short fibers. Textile glass short fibers have a fiber length of less than 1 mm, according to DIN 61850. The average fiber length preferably amounts to approximately 0.2 mm. In particular, mineral filler materials, which can be used with or without adhesive agents, serve as inorganic filler materials. These kinds of filler materials are carbonates such as dolomite, e.g. in the form of Microdol ®, as well as aluminum oxide and hydrated aluminum oxide. Preferably serving as filler materials are low alpha-emitting powders of quartz or fused quartz, in particular of low alpha-emitting raw materials such as rock crystal as well as silicon dioxide ($SiO_2$) with low alpha activity, as is known for example from DE-OS 33 23 844. This type of silicon dioxide is free of impurities, in particular from the elements thorium and uranium, which are responsible for the emission of alpha-rays. Therefore, this type of silicon dioxide has emission rates of <0.01 alpha particles/$cm^2$.h. For example, aramide and polyphenylensulfide fibers can be used as organic fibers.

The concentration of filler material generally amounts to 50 to 85 mass-% in the epoxide resin molding compositions according to the invention; preferably, this concentration amounts to 60 to 80 mass-%. If the filler material also contains textile glass short fibers in addition to powdery mineral material, then the fiber concentration in the filler material mixture preferably amounts to 3 to 40 mass-%. Also, fibrous filler materials on a mineral base, e.g. calcium silicates such as wollastonite, come under consideration singly or in a mixture with other mineral filler materials as filler materials.

The preparation of the epoxide resin molding compositions according to the invention can take place in a manner such that the constituents (A), (B), (C) and (D) are directly mixed together in suitable mixing devices such as a roller mill (so-called dry preparation). However, the preparation can also be undertaken in a manner such that the filler material is introduced into a solution of (A), (B) and (C) in a suitable organic solvent (so-called wet preparation). These types of solvents are e.g. acetone, ethylacetate, methyl-ethyl ketone and methylglycol (2-methoxyethanol), whereby ketonic solvents are used in particular, preferably acetone. Thereby, the solutions preferably have a concentration of 40 to 60 mass-% of the constituents (A), (B), and (C). After the introduction of the filler materials and the mixing, the solvent is removed in a vacuum, e.g. at a pressure of I mbar and a temperature of 60° C.

The epoxide resin molding compositions according to the invention have a higher storage stability at room temperature over more than 6 months than the molding compounds currently found in technical application. A faultless processability is guaranteed within this time period; in contrast, a rapid cross-linkage takes place at temperatures above 150° C. The molding compounds according to the invention distinguish themselves further through lower reaction loss [shrinkage]. In addition to the said constituents, incidentally, the molding compositions according to the invention can contain additional additives such as accelerators, lubricating and release agents [for moldings], pigments, flexibilizers, coupling reagents and stabilizing agents.

The epoxide resin molding compositions according to the invention are generally processed according to the usual transfer molding process; i.e., they are press-molded under high pressure and at an elevated temperature. Technically speaking, work is thus preferably carried out nowadays using multiplungers with multicavity molds. These molding compositions are then converted into the appropriate molded materials in a rapidly proceeding cross-linkage reaction at temperatures above 150° C.

The epoxide resin molded materials prepared from the epoxide resin molding compositions according to the invention have a low linear thermal expansion coefficient in addition to a high glass transition temperature ($T_G > 200°$ C.), and, indeed, in the temperature range from room temperature to over 200° C. Depending on the type of filler material and filler material concentration, the thermal expansion coefficient lies in the range from 15 to $25 \times 10^{-6}$ K$^{-1}$. Due to the lack of a rapid change in the temperature range being used, less stresses are exerted on the entire system. Through the appropriate selection of the residues R', $A^1$ and $A^1$ of the constituent (B), these stresses are even further reduced. The molded materials according to the invention, moreover, are self-extinguishing. Without the addition of halogen compounds or other flame-retarding additives, the flammability test according to UL 94 V is withstood with a solid V-O rating having a mean burning time of $<<5$ seconds, even in test pieces having a wall thickness of $\leq 1.6$ mm. Thus it has proved to be particularly advantageous that no corrosive or particularly toxic cleavage products are formed and that the development of smoke is greatly reduced in comparison to other polymer materials, in particular to bromine-containing epoxide resin molded materials.

The cured molded materials are further distinguished by a high resistance towards chemicals, corrosion resistance, low moisture absorption and very good electrical property values. Furthermore, these molded materials display a good adhesion to metals, which is very important for protectively covering semiconductor components; and, moreover, the tightness of the pins against intruding moisture is thereby guaranteed.

The invention shall be more closely explained in light of the exemplified embodiments.

EXAMPLE 1

Production of Molding Compositions a) Wet Preparation (Preparation in a solvent)

A solution of A parts by weight (MT) of an epoxidized novolak (having an epoxide value of 0.57) in B parts by weight acetone is mixed with a solution of C parts by weight of a polyamine—which was prepared into a product having an NH$_2$-value of 8.7% by means of a trimerization of a 4:1 mixture of toluene-2.4-diisocyanate and toluene-2.6-diisocyanate and a subsequent hydrolysis—in D parts by weight acetone and with E parts by weight phenyl-diglycidyl-phosphonate (for manufacturing process c.f. "Zh. Obshch. Khim.", Vol. 54, Issue 10 (1984), pp. 2404 fol.). The composition of various mixtures may be taken from Table 1. These mixtures are mixed with F parts by weight of fused quartz powder, e.g. Silbond FW 12 EST (Fa. Quarzwerke GmbH). The mixtures are then poured out onto an aluminum foil and then the solvent is removed in a vacuum-drying oven (pressure: 1 mbar; temperature: 60° C.; time: 30 min.). The resulting sprinklable masses are storage stable for at least 6 months at room temperature, and at 5° C. even considerably longer, and thus clearly surpass the shelf life of the molding compounds currently being used in technical applications.

b) Dry Preparation

A parts by weight (MT) of an epoxidized novolak (having an epoxide value of 0.57) are mixed with C parts by weight of a polyamine which was produced as previously described above (NH2-value: 8.7%), E parts by weight phenyl-diglycidyl-phosphonate and F parts by weight of fused quartz powder, e.g. Silbond FW 12 EST, and are thoroughly mixed together for 30 minutes on a roller mill (roller temperature: 30° to 60° C.). The respective parts by weight are to be taken from Table 1. In this manner, sprinklable masses are obtained which are storage stable for more than 6 months at room temperature, and at 5° C. even considerably longer, and thus clearly surpass the shelf life of the molding compositions currently being used in technical applications.

TABLE 1

| Experiment No. | 1 | 2 | 3 | 4 | 5 |
|---|---|---|---|---|---|
| Roller Temperature (°C.) | 60 | 50 | 40 | 30 | 30 |
| Constituents: | | | | | |
| A (MT) | 66 | 48 | 42 | 34 | 0 |
| B (MT) | 66 | 48 | 42 | 34 | 0 |
| C (MT) | 34 | 36 | 36 | 36 | 40 |
| D (MT) | 34 | 44 | 47 | 51 | 70 |
| E (MT) | 0 | 16 | 22 | 30 | 60 |
| F (MT) | 234 | 234 | 234 | 234 | 234 |

EXAMPLE 2:

Production of Molded Materials in the Form of Test Pieces

Storage stable molding compositions according to Example 1 are machined into test pieces according to the customary transfer molding process (press-molding temperature: 175° C.; press-molding pressure: 100 bar; press-molding time: 4 min.). The measurement of the thermo-mechanical properties and the flammable behavior [property] of the test pieces, which takes place according to the customary DIN-methods, produces the results which are compiled in Table 2.

In order to be able to make a comparison with the state of technology, the polyamine was replaced in a further experiment by the curing agent dicyandiamide, which up until now has been used the most in technical application. For this purpose, 60 parts by weight Phenyl-diglycidyl-phosphonate were mixed with a solution of 9 parts by weight dicyandiamide in 15 parts by weight dimethyl formamide and with 0.9 parts by weight dimethylbenzylamine. The solution thus obtained was mixed with 163 parts by weight fused quartz Powder, e.g. Silbond FW 12 EST, and, as described in Example 1a, was prepared into a sprinklable mass. It was established during press-molding [process] that even after 45 minutes, this mass does not become stable in form at 175° C. A sufficient curing could not be obtained even after 120 minutes at 180° C. Therefore, a further evaluation of this system was dispensed with.

TABLE 2

|  | Experiment No. | | | | |
| --- | --- | --- | --- | --- | --- |
|  | 1 | 2 | 3 | 4 | 5 |
| Measuring values after the press-molding process: | | | | | |
| Glass transition temperature $T_G$ (°C.) | 210 | 215 | 215 | 220 | 220 |
| Bending strength (N/mm$^2$) | 168 ± 17 | 152 ± 14 | 147 ± 12 | 146 ± 12 | 146 ± 12 |
| Impact resistance (Nmm/mm$^2$) | 5.7 ± 1.4 | 5.5 ± 1.2 | 5.3 ± 1.0 | 5.1 ± 1.0 | 5.1 ± 1.0 |
| Measuring values after curing*): | | | | | |
| $T_G$ (°C.) | 245 | 255 | 260 | 260 | 260 |
| Bending strength (N/mm$^2$) | 134 ± 20 | 138 ± 20 | 143 ± 18 | 144 ± 15 | 146 ± 12 |
| Impact resistance (Nmm/mm$^2$) | 6.2 ± 1.1 | 5.8 ± 1.0 | 4.8 ± 0.8 | 4.9 ± 1.0 | 5.0 ± 1.0 |
| Mean burning time according to UL 94V: | | | | | |
| of 1 mm-test pieces (s) | >40 | 4.2 | 3.5 | 2.0 | <1 |
| of 3 mm-test pieces (2) | >40 | 1.8 | 1.6 | <1 | 0 |
| Rating | not possible | V-O | V-O | V-O | V-O |

*)2 hours at 190° C. and 2 hours at 210° C.

Example 3

42 parts by weight of an epoxidized novolak (having an epoxide value of 0.57), 17 parts by weight triglycidyl phosphate and 37 parts by weight of a polyamine (having an NH$_2$-value of 8.7%), which was produced according to example 1a, are dry mixed as described in example 1b with 224 parts by weight fused quartz powder, e.g. Silbond FW 12 EST, and are press-molded into the test pieces required according to the DIN-regulations in order to assess the thermo-mechanical properties and the flammable property [behavior] (press-molding temperature: 175° C.; press-molding pressure: 100 bar; press-molding time: 4 min.). Directly after the press-molding process, the following values are measured: $T_G$ = 240° C., bending strength: 139 + 13 N/mm$^2$ impact resistance: 5.6 + 0.2 Nmm/mm$^2$. After two hours of curing at 190° C. and an additional 2 hours at 210° C., a $T_G$ of 270° C. is found at a nearly unchanged impact resistance and bending strength. These values verify the possibility of a very short cycle time when press-molding the molding compositions. A mean postburning time according to UL 94 V of 3 seconds was found on 3 mm rods, which corresponds to a V-O rating.

Example 4

The quantities specified in Table 3 of an epoxidized novolak (having an epoxide value of 0.57), a polyamine (having an NH$_2$-value of 8.7%) which is produced according to example 1a, a glycidyl-group-containing phosphorous compound, and fused quartz powder, e.g. Silbond FW 12 EST, are mixed on a roller mill as is described in example 1b. The storage stable molding compositions thus obtained are processed into test pieces, as is described in example 2. Table 3 includes the glass transition temperature $T_G$ which was measured on these test pieces and the mean burning time according to UL 94V, which was detected on 1 mm thick test pieces.

TABLE 3

|  | Experiment No. | | | | | |
| --- | --- | --- | --- | --- | --- | --- |
|  | 6 | 7 | 8 | 9 | 10 | 11 |
| Constituents: | | | | | | |
| Epoxidized novolak [resin] (MT) | 175 | 175 | 175 | 175 | 175 | 175 |
| Polyamine (MT) | 183 | 183 | 183 | 183 | 183 | 183 |
| Methyl-diglycidyl-phosphonate[1] (MT) | 104 | — | — | — | — | — |
| Ethyl-diglycidyl-phosphonate[1] (MT) | — | 111 | — | — | — | — |
| Methyl-diglycidyl-phosphate[2] (MT) | — | — | 112 | — | — | — |
| Ethyl-diglycidyl-phosphate[2] (MT) | — | — | — | 119 | — | — |
| Phenyl-diglycidyl-phosphate[2] (MT) | — | — | — | — | 143 | — |
| p-methoxyphenyl-diglycidyl-phosphate[2] (MT) | — | — | — | — | — | 158 |
| Fused quartz dioxide powder (MT) | 1078 | 1094 | 1096 | 1113 | 1169 | 1204 |
| Measuring values after press-molding*) and after-bake curing**): | | | | | | |
| Glass transition temperature $T_G$ (°C.) | 270 | 270 | 260 | 260 | 270 | 260 |
| Mean burning time according to UL 94V (s) | 2.5 | 4.0 | 2.0 | 3.1 | <1 | 2.0 |
| Rating | V-O | V-O | V-O | V-O | V-O | V-O |

[1]c.f. "Zh. Obshch. Khim." 54 (10), 2404 (1984) or C.A. 102 (19) 166845d
[2]c.f. "Isv. Akad. Nauk. SSSR", Ser. Khim. (9), 2006 (1967) or C.A. 68 (7), 29789d
*)4 minutes at 175° C.
**)2 hours at 190° C. and 2 hours at 210° C.

EXAMPLE 5

The quantities specified in Table 4 of an epoxide resin, a polyamine according to example 1a (NH$_2$-value: 8.7%), of phenyl-diglycidyl-phosphonate and of fused quartz powder, e.g. Silbond FW 12 EST, are mixed on a roller mill as described in example 1b. The storage stable molding compositions thus obtained are processed into test pieces as described in example 2. Table 4 includes the glass transition temperature $T_G$ which was measured on these test pieces and the mean burning time according to UL 94V which was detected on 1 mm thick test pieces.

TABLE 4

| | Experiment No. | | | | |
|---|---|---|---|---|---|
| | 12 | 13 | 14 | 15 | 16 |
| Constituents: | | | | | |
| Epoxidized novolak [resin][1] (MT) | 185 | 93 | — | — | — |
| Oxazolidinone-modified epoxide resin[2] (MT) | — | 238 | — | — | — |
| Bisphenol-A-diglycidyl ether[3] (MT) | — | — | 175 | — | — |
| Bisphenol-F-diglycidyl ether[4] (MT) | — | — | — | 164 | — |
| Hydantoin epoxide resin[5] (MT) | — | — | — | — | 175 |
| Polyamine (MT) | 183 | 183 | 183 | 183 | 183 |
| Phenyl-diglycidyl-phosphonate (MT) | 135 | 135 | 135 | 135 | 135 |
| Fused quartz powder (MT) | 1174 | 1514 | 1150 | 1125 | 1150 |
| Measuring values after press-molding*) and after-bake curing**): | | | | | |
| Glass transition temperature $T_G$ (°C.) | 275 | 215 | 260 | 255 | 270 |
| Mean burning time according to UL 94V (s) | 1.2 | 4.2 | 2.2 | 1.5 | 3.0 |
| Rating | V-O | V-O | V-O | V-O | V-O |

[1] Epoxide value: 0.54; viscosity at 15° C.: 600 cSt
[2] Epoxide value: 0.21
[3] Epoxide value: 0.57; viscosity at 25° C.: 4,000 to 6,000 mPa.s
[4] Epoxide value: 0.61; viscosity at 25° C.: 1,200 ± 100 mPa.s
[5] Epoxide value: 0.57; viscosity at 80° C.: 9,000 mPa.s
*) 4 minutes at 175° C.
**) 2 hours at 190° C. and 2 hours at 210° C.

What is claimed is:

1. An epoxide resin molding composition for protectively covering semiconductor components, comprising:
   (A) at least one of an aromatic polyepoxide resin and a heterocyclic polyepoxide resin which are free of phosphorous,
   (B) an epoxide group-containing phosphorous compound of the following structure:

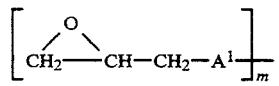

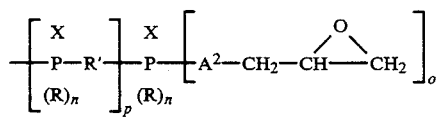

with m=0 or 1, n=0, 1 or 2 and o=1, 2 or 3, and wherein the following holds: m+n+o=3, and with p=0, 1 or 2;

X signifies a free electron pair or an O— or S-atom bonded by way of a double bond;

R signifies an alkyl residue having 1 to 4 C-atoms; alkenyl residue having 2 to 3 C-atoms; aryl residue; arylalkyl residue;

dialkyl-amino or alkyl-aryl-amino residue or 3-trialkylsilyl-propyl residue; R being bonded directly or by way of O or S;

R' denotes a bridge of O, S, phenylene, dioxyphenylene, dioxynaphthylene, $(CH_2)_r$, O—$(CH_2)_r$, O—$(CH_2)_r$—O or O—$(CH_2)_r$—Si$(CH_3)_2$—O$_s$—Si$(CH_3)_2$—$(CH_2)_r$—O with r=1 to 3 and s=1 to 8, or (O—$CH_2$—$CH_2)_r$—O, (O—CH$(CH_3)$—$CH_2)_r$—O or (O—$(CH_2)_4)_t$ —O with t=2 to 100; and A$^1$ and A$^2$, which can be equal or different, denote a single bond or a bridge according to the grouping R';

(C) an aromatic polyamine as a curing agent of the following structure:

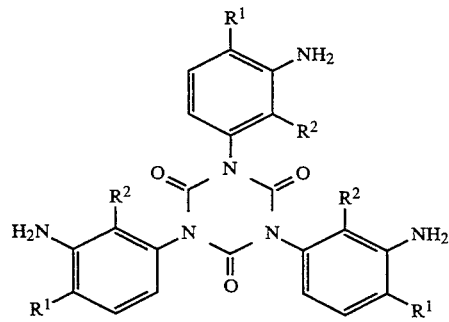

where on each of the three aromatic partial structures, one of the residues R$^1$ and R$^2$ respectively denotes H and the other alkyl; and (D) filler material.

2. An epoxide resin molding composition according to claim 1, wherein the constituent (B) is a di- or triglycidylester of phosphoric acid or a mixture of these compounds.

3. An epoxide resin molding composition according to claim 1, wherein the constituent (B) is a diglycidylester of an alkyl- or arylphosphonic acid.

4. An epoxide resin molding composition according to claim 1, wherein the constituent (B) is a di- or triglycidylester of phosphorous acid or a mixture of these compounds.

5. An epoxide resin molding composition according to claim 1 wherein the ratio of the constituent (A) to the constituent (B) is from 10:1 to 1:10.

6. An epoxide resin molding composition according to claim 1 wherein the ratio between the epoxide function and the amine-hydrogen is from 0.9:1 to 1.1:1.

7. An epoxide resin molding composition according to claim 1 wherein the constituent (C) is a mixture of polyamines, which are produced by means of the trimerization of a mixture of 2.4 and 2.6 diisocyanato-alkylbenzenes and subsequent hydrolysis.

8. An epoxide resin molding composition according to claim 1 wherein the constituent (C) is present as a curing agent in the mixture with additional aromatic and/or heterocyclic polyamines.

9. An epoxide resin molding composition according to claim 8 wherein the concentration of the constituent C in the curing agent mixture amounts to at least 70 mass-%.

10. An epoxide resin molding composition according to claim 1 wherein the polyepoxide resin is an epoxidized novolak.

11. An epoxide resin molding composition according to claim 1 wherein the filler materials are powdery inorganic and/or organic materials, optionally in a mixture with inorganic and/or organic short fibers.

12. An epoxide resin molding composition according to claim 11, wherein the filler material is low alpha-emitting fused quartz powder.

13. An epoxide resin molding composition according to claim 1, wherein the concentration of filler material is from 50 to 85 mass-%.

14. An epoxide resin molded material comprising an epoxide resin molding composition according to claim 1.

15. An epoxide resin molding composition according to claim 5 wherein the ratio of constituent (A) to constituent (B) is from 4:1 to 16. An epoxide resin molding composition according to claim 6 wherein the ratio between the epoxide function and the amine-hydrogen is about 1:1.

17. An epoxide resin molding composition according to claim 13 wherein the concentration of filler material is from 60 to 80 mass-%.

* * * * *